(12) United States Patent
Onozawa

(10) Patent No.: US 7,714,353 B2
(45) Date of Patent: May 11, 2010

(54) INSULATED GATE SEMICONDUCTOR DEVICE AND THE METHOD OF MANUFACTURING THE SAME

(75) Inventor: Yuichi Onozawa, Matsumoto (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 12/122,291

(22) Filed: May 16, 2008

(65) Prior Publication Data

US 2008/0315250 A1 Dec. 25, 2008

(30) Foreign Application Priority Data

May 17, 2007 (JP) ............... 2007-131119

(51) Int. Cl.
H01L 29/74 (2006.01)
H01L 21/332 (2006.01)

(52) U.S. Cl. ...................... 257/137; 438/133

(58) Field of Classification Search .......... 257/E29.199, 257/328, 330, 137–139; 438/133–138
See application file for complete search history.

(56) References Cited

U.S. PATENT DOCUMENTS

| 6,005,271 | A | 12/1999 | Hshieh |
| 6,072,214 | A | 6/2000 | Herzer et al. |
| 6,218,217 | B1 | 4/2001 | Uenishi et al. |
| 6,566,691 | B1 | 5/2003 | Inoue et al. |
| 6,777,743 | B2 | 8/2004 | Hasegawa |
| 2001/0054738 | A1 | 12/2001 | Momota et al. |
| 2003/0160270 | A1 | 8/2003 | Pfirsch et al. |
| 2005/0006700 | A1 | 1/2005 | Cao |
| 2005/0032280 | A1* | 2/2005 | Yanagisawa ............... 438/138 |
| 2006/0163649 | A1 | 7/2006 | Otsuki |

FOREIGN PATENT DOCUMENTS

| JP | 5-243561 A | 9/1993 |
| JP | 2000-228519 A | 8/2000 |
| JP | 2001-274400 A | 10/2001 |
| JP | 2001-308327 A | 11/2001 |
| JP | 3410913 B2 | 3/2003 |
| JP | 3545590 B2 | 4/2004 |
| JP | 2006-210547 A | 8/2006 |

OTHER PUBLICATIONS

Office Action dated Jan. 16, 2009, issued in Chinese Patent Application No. 200510103685.3 which corresponds with related U.S. Appl. No. 11/226,860; partial English translation provided.
Yamaguchi et al.; "IEGT Design Criterion for Reducing EMI Noise"; Proc. ISPSD 2004; pp. 115-119; cited in specification.
Second Office Action Reasons of Rejection which was issued in corresponding Chinese Patent Application No. 2005101036853 dated Jul. 17, 2009 and cited in related co-pending U.S. Appl. No. 11/226,860, filed Sep. 14, 2005.

* cited by examiner

Primary Examiner—Calvin Lee
(74) Attorney, Agent, or Firm—Rossi, Kimms & McDowell LLP

(57) ABSTRACT

A trench-type insulated-gate semiconductor device is disclosed that includes unit cells having a trench gate structure that are scattered uniformly throughout the active region of the device. The impurity concentration in the portion of a p-type base region, sandwiched between an n+-type emitter region and an n-type drift layer and in contact with a gate electrode formed in the trench via a gate insulator film, is the lowest in the portion thereof sandwiched between the bottom plane of n+-type emitter regions and the bottom plane of p-type base region and parallel to the major surface of a silicon substrate. The trench-type insulate-gate semiconductor device according to the invention minimizes the variation of the gate threshold voltage.

8 Claims, 13 Drawing Sheets

INSULATED GATE SEMICONDUCTOR DEVICE AND THE METHOD OF MANUFACTURING THE SAME

CROSS REFERENCE TO RELATED APPLICATIONS

This application claims priority from Japanese application Serial No. 2007-131119, filed on May 17, 2007, the contents of which are incorporated herein by reference in their entirety.

BACKGROUND OF THE INVENTION

A. Field of the Invention

The present invention relates to insulated gate semiconductor devices (hereinafter referred to as "IGBT's").

B. Description of the Related Art

In exploring the developments of electric power converters that exhibit low electric power consumption, power devices that play a key role in the electric power converters have been expected to exhibit low electric power consumption. Among the power devices, insulated gate bipolar transistors (hereinafter referred to as "IGBT's") are preferable to achieve a low ON-state voltage due to their conductivity modulation effects. Moreover, the IGBT's are controlled easily via their gate with a voltage applied thereto. Therefore, the use of the IGBT's has been established. The IGBT's may be classified into a planar IGBT and a trench IGBT. The planar IGBT includes gate electrodes formed along a chip surface. The trench IGBT includes gate electrodes buried in the respective trenches formed perpendicularly from a chip surface with an oxide film interposed between each gate electrode and the wall of the pertinent trench. The trench IGBT is more advantageous than the planar IGBT for increasing the channel density, since channels are formed in the side walls of the trenches. Therefore, the application fields for the trench IGBT are increasing.

Now the structure of the conventional trench IGBT as described above will be described in detail below with reference to FIG. 9. FIG. 9 shows a cross section of an n-channel IGBT including trench gates, the planar pattern of which includes stripes extending in parallel to each other. The cross section shown in FIG. 9 is cut perpendicular to the stripe-shaped trench gates.

Referring now to FIG. 9, a silicon wafer includes a lightly-doped n-type silicon substrate serving as drift layer 2-1, n$^+$-type field stop layer 2-2 on a first surface of drift layer 2-1, and heavily-doped p-type thin collector layer 1-1, the impurity concentration of which is controlled, on field stop layer 2-2. A plurality of p-type base regions 3 are formed on a second surface of drift layer 2-1. In the surface portion of p-type base region 3, n$^+$-type emitter regions 4 are formed selectively. Trench 20 is formed from the surface of n$^+$-type emitter regions 4 to drift layer 2-1 through p-type base region 3. Gate electrode 6 made of electrically-conductive polycrystalline silicon is formed in trench 20 with gate oxide film 5 interposed between gate electrode 6 and the wall of trench 20. Interlayer insulator film 7 on trenches 20 insulates gate electrodes 6 from emitter electrode 8 formed on interlayer insulator film 7. Emitter electrode 8 is formed in such a manner that emitter electrode 8 is in electrical contact commonly with n$^+$-type emitter regions 4 and p-type base regions 3 via windows formed through interlayer insulator film 7. Collector electrode 9 is formed on the back surface of p-type thin collector layer 1-1.

For bringing the trench IGBT shown in FIG. 9 into the ON-state, a voltage higher than the threshold voltage is applied to gate electrodes 6 in the state in which a voltage higher than the voltage applied to emitter electrode 8 is applied to collector electrode 9. As electric charges are accumulated to gate electrodes 6 by the voltage application described above, channels (not shown) inverted to the n-type are formed in the walls of p-type base regions 3 facing to respective gate electrodes 6 via gate oxide films 5. Electrons are injected from n$^+$-type emitter regions 4 into drift layer 2-1 via the n-channels. The injected electrons bias collector junction 1-2 in forward and holes are injected from collector electrode 9, resulting in the ON-state of the trench IGBT. The voltage drop between collector electrode 9 and emitter electrode 8 in the resulting ON-state is the ON-state voltage.

For bringing the IGBT from the ON-state to the OFF-state, the voltage between emitter electrode 8 and gate electrode 6 is lowered below the threshold. By lowering the voltage, the electric charges accumulated in gate electrode 6 are discharged to a gate driver circuit via gate resistance. As the electric charges are discharged, the channel regions that have been inverted to the n-type return to the p-type, interrupting the electron path. Thus, the electron feed to drift layer 2-1 is interrupted. As the electron feed to drift layer 2-1 is interrupted, the hole feed from the collector side is also interrupted. Therefore, the electrons and holes accumulated in drift layer 2-1 are ejected to collector electrode 9 and emitter electrode 8, respectively, or recombine with each other. Thus, the electric current vanishes, bringing the IGBT to the OFF-state thereof.

Various improvements have been proposed to further lower the ON-state voltage of the trench IGBT. The injection enhanced gate bipolar transistor (hereinafter referred to as the "IEGT") disclosed in Unexamined Japanese Patent Application Publication No. Hei. 5(1993)-243561 (FIG. 101), which is a counterpart of U.S. Pat. No. 5,329,142 (hereinafter referred to as "JP 1993-243561") exhibits an extremely low ON-state voltage close to the ON-state voltage of the diode. The trench IEGT shown in FIG. 101 of JP 1993-243561 has a structure in which a part of the surface of an n$^+$-type emitter region and a part of the surface of a p-type base region are covered with an insulator film such that the part of the emitter region and the part of the p-type base region are not in contact with an emitter electrode. The holes in the portion of the p-type base region not in contact with the emitter electrode are hardly ejected to the emitter electrode but liable to be accumulated. As a result, the carrier concentration distribution in an n-type drift layer is close to that in the diode. Therefore, the ON-state voltage of the disclosed trench IEGT can be set to be lower than the ON-state voltage of the trench IGBT. JP 1993-243561 names the effect which the disclosed trench IEGT exhibits an "IE effect."

Power devices have been required to exhibit high-speed switching performances in addition to exhibiting a low ON-state voltage. It has been an important object for conventional IGBT's to improve their high-speed switching performances. However, since trench structures are formed very densely in conventional trench IGBT and trench IEGT, the capacitance between the gate electrode and the emitter electrode is liable to be larger than usual, impairing the switching performance. Therefore, it also is important to reduce the capacitance between the gate electrode and the emitter electrode, which causes impaired switching performances.

Now the IEGT shown in FIG. 1 of the Unexamined Japanese Patent Application Publication No. 2001-308327 (FIG. 1), which is a counterpart of U.S. Pat. No. 6,737,705 (hereinafter referred to as "JP 2001-308327") will be described below with reference to FIG. 9 attached to the description of the present invention and equivalent to FIG. 1 of JP 2001-

308327. The mesa region in the conventional IEGT, sandwiched by trench gates equivalent to those sandwiching region 11 in FIG. 9, is covered with an insulator film in the same manner as region 11 in FIG. 9. The mesa region potential floats in the same manner as the potential of region 11 in FIG. 9. (Here, "mesa" means "trapezoidal.") The portion of the trench gate structure in the conventional IEGT covered with an insulator layer does not exhibit all the primary functions effectively in the same manner as the portion of the trench gate covered with an insulator layer in FIG. 9. Therefore, the capacitance between the gate electrode and the emitter electrode in the conventional IEGT is reduced as compared with the usual IGBT, and the trench gate structure thereof exhibits all the primary functions effectively. The conventional IEGT disclosed in JP 2001-308327 shortens the charging and discharging times and reduces the switching loss.

Yamaguchi et al. have reported that the IEGT disclosed in JP 2001-308327 has problems to be solved with respect to its turn-on characteristics ("IEGT Design Criterion for Reducing EMI Noise", *Proc. ISPSD* 2004, pp. 115-119, 2004). The IEGT disclosed in JP 1993-243561 also has problems to be solved with respect to the turn-on characteristics. Therefore, it is a first object of the present invention to improve the turn-on characteristics.

It is essentially difficult for the IGBT shown in the above-described FIG. 9 to exhibit a high device breakdown voltage. The difficulty in obtaining a high device breakdown voltage poses a second problem for the IGBT shown in FIG. 9. Since the trenches are spaced apart from each other with unequal distances, the electric field distribution is liable to be nonuniform, causing electric field localization to the trench gate bottom. Therefore, the breakdown voltage of the IGBT shown in the FIG. 9 is liable to be lower.

To alleviate the first and second problems, Unexamined Japanese Patent Application Publication No. 2006-210547 (Abstract), which is a counterpart of U.S. Patent Application Publication No. US 2006/0163649 (hereinafter referred to as "JP 2006-210547"), and Unexamined Japanese Patent Application Publication No. 2000-228519 (FIGS. 6 and 7), which is a counterpart of U.S. Pat. No. 6,380,586 (hereinafter referred to as "JP 2000-210547"), disclose an IGBT, the perspective view of which is shown, for example, in FIG. 1 of the former document. The disclosed IGBT has a trench gate structure that includes trenches, the surface pattern of which includes a repetition of stripes extending in parallel to each other. The trenches dug in perpendicular to the semiconductor substrate surface are formed by etching the semiconductor substrate from its surface. The trench gate structure includes a gate electrode buried in each trench with an insulator film interposed between the gate electrode and the wall of the trench. The trench gate structure also includes p-type base regions and the extended portions of an n-type drift layer arranged alternately in the longitudinal direction of the semiconductor substrate surface between the trenches. In other words, the n-type drift layer extends between the p-type base regions between an adjacent pair of the trenches. The IGBT disclosed in these two documents and having the trench gate structure as described above exhibits a low ON-state voltage, low switching losses, improved turn-on characteristics, and a high breakdown voltage.

Now the IGBT disclosed in JP 2006-210547 will be described more in detail. The IGBT disclosed in JP 2006-210547 is characterized in that the mesa region thereof is connected to the emitter electrode via resistance to fix the mesa region potential so that the mesa region sandwiched by the trenches may not be a perfect floating region, the potential thereof is floating completely. The IGBT disclosed in JP 2006-210547, having the specific feature as described above, improves the turn-on characteristics thereof and obviates the first problem. As described in the above-described Yamaguchi et al., the potential of the mesa region in the floating state varies the gate potential in the process of turning-on. The gate potential variations destabilize the turn-on operation of the IGBT, causing problems in the controllability of the IGBT.

Removal of a floating region may be an essential measure for solving the above-described problem. However, if the floating region is simply removed, the usual IGBT, which does not exhibit any IE effect, will be obtained, causing a higher ON-state voltage. Therefore, a first measure of removing a floating region cannot be employed alone. So as not to impair the IE effect, it is necessary to use another measure together with removal of the floating region.

For example, the mesa region sandwiched between the trenches is divided into p-type regions and limited portions in the mesa region are provided with an emitter structure as a second measure. The second measure reduces the switching loss while suppressing the ON-state voltage of the trench IGBT as low as the ON-state voltage of the IEGT, and thus further reduces the total losses. If the first and second measures are employed together, the regions, in which the gate electrode faces the emitter structure, will decrease. Therefore, the electric field distributions in the base region and in the trench gate bottom will be nonuniform, further lowering the breakdown voltage of the device and impairing the reliability of the trench gate.

Therefore, it is necessary to employ a third measure to make the electric field distributions in the base region and in the trench gate bottom uniform in addition to the first and second measures. In detail, the n-type layer portion in the mesa region between the trench gates is set at a width narrow enough to be depleted easily by an applied voltage of several V to relax the electric localization to the trench gate bottom so that a high breakdown voltage may be obtained.

The IGBT disclosed in JP 2006-210547 and provided with the first through third measures facilitates making the electric field distribution near the surface of the device in the OFF-state thereof uniform and improving the breakdown voltage. Moreover, the IGBT disclosed in JP 2006-210547 and provided with the first through third measures facilitates reducing the capacitance between the gate electrode and the collector electrode. Thus, the IGBT disclosed in JP 2006-210547 and provided with the first through third measures also obviates the first and second problems.

However, the gate threshold voltage of the IGBT disclosed in JP 2006-210547 is liable to vary. This problem can be described in detail as follows. First, the structure of the IGBT disclosed in JP 2006-210547 will be described with reference to FIGS. 10-13. FIG. 10 is a perspective and cross sectional view of a trench IGBT taken in perpendicular to the wafer surface and trenches. FIG. 11 is a cross sectional view taken along line segment A-A of FIG. 10. FIG. 12 is a cross sectional view taken along line segment B-B of FIG. 10. FIG. 13 is a cross sectional view taken along line segment C-C of FIG. 10.

Referring now to these drawings, a silicon wafer includes heavily doped p-type collector layer 1-1, $n^+$-type field stop layer 2-2, and lightly doped n-type drift layer 2-1. In the drift-layer-side surface portion of the silicon wafer, p-type base regions 3 are formed selectively. In p-type base region 3, $n^+$-type emitter regions 4 are formed selectively. In FIG. 10, p-type base regions 3 are scattered such that p-type base regions 3 and the extended portions of lightly doped n-type drift layer 2-1 appear alternately in the longitudinal direction of trench 20. In the direction perpendicular to trenches 20, p-type base regions 3 are arranged such that p-type base regions 3 and the extended portions of lightly doped n-type drift layer 2-1 are positioned alternately with trench 20 interposed between base region 3 and the extended portion of drift layer 2-1. In the entire surface of the active region, in which an effective current flows, p-type base regions 3 are arranged in a staggered manner such that a checkered surface pattern is formed. It is preferable to arrange p-type base regions 3 in a staggered manner as described above, since p-type base regions 3 are distributed uniformly throughout the active region. The uniform distribution of p-type base regions 3 makes the electric field distribution uniform and prevents the IGBT from breakdown.

Trench 20 is filled with polycrystalline silicon gate electrode 6 working as a control electrode with gate oxide film 5 interposed between the wall of trench 20 and gate electrode 6. As shown in FIG. 11, a portion in the major surface of the silicon substrate, to which gate electrode 6 and drift layer 2-1 are extended, is covered with interlayer insulator film 7. On interlayer insulator film 7, emitter electrode 8 is formed such that emitter electrode 8 is in contact commonly with $n^+$-type emitter region 4 and p-type base region 3. On the (back) surface of p-type collector layer 1-1, collector electrode 9 is formed. Since p-type base regions 3 are distributed in the surface of drift layer 2-1 between trenches 20 extended in parallel to each other, p-type base region 3 is expanded such that p-type base region 3 is diffused laterally only in the longitudinal direction of trench 20 from a window for ion implantation.

As shown in FIGS. 9-11, $n^+$-type emitter regions 4 are disposed only adjacent to the trench side walls. Since the cross section B-B shown in FIG. 12 does not cut any $n^+$-type emitter region 4, $n^+$-type emitter region 4 is not shown in FIG. 12. In the cross section C-C shown in FIG. 13, $n^+$-type emitter regions 4 are shown. In FIG. 10, the portion in which emitter electrode 8 is in contact commonly with $n^+$-type emitter region 4 and p-type base region 3 is an emitter contact 10, illustrated by a shaded portion.

In the IGBT described in JP 2006-210547, p-type base regions 3, each shaped with a cell, are distributed in the active region surface. Therefore, electrons are injected radially from $n^+$-type emitter region 4 in each cell to drift layer 2-1 via p-type base region 3 as illustrated by arrows 30 in FIG. 13. If the gate threshold voltage of a channel portion, on the most substrate-surface-side and designated by x, is lower than the gate threshold voltage of the other channel portions y, the gate threshold voltage of the entire semiconductor device will be determined by the channel portion x. In the portion x near to the substrate surface, the relative positional relation between the mesa region and the emitter region is liable to change. Since the peak concentration in the mesa region changes when the relative positional relation between the mesa region and the emitter region changes, the channel portion x is adversely affected easily by the gate threshold voltage deviating from the desired value and such causes. Therefore, the IGBT described in JP 2006-210547 causes a wider threshold voltage variation easily as compared with the IGBT described in JP 1993-243561.

In view of the foregoing, it would be desirable to obviate the problems described above. It would be also desirable to provide an insulated gate semiconductor device having a trench IGBT structure that distributes cell units having a trench gate structure throughout the active region and that can minimize threshold voltage variations.

The present invention is directed to overcoming or at least reducing the effects of one or more of the problems set forth above.

SUMMARY OF THE INVENTION

In an insulated gate semiconductor device according to the present invention as recited in claim 1 that includes unit cells having a trench gate structure and scattered uniformly throughout the active region, in a portion of the p-type base region in contact with the gate electrode via the gate insulator film, the impurity concentration in the portion of a p-type base region sandwiched between the bottom plane of the p-type base region and the bottom plane of an $n^+$-type emitter region and parallel to the major surface of a semiconductor substrate is the lowest.

According to the subject matter of claim 2, the ion implantation window for forming the p-type base region overlaps onto the $n^+$-type emitter region for 0.8 μm or longer in the insulated gate semiconductor device as described in Claim 1.

According to the subject matter of claim 3, the insulated gate semiconductor device described in claim 1 further includes a p-type diffusion region doped more heavily than the p-type base region, in contact with the trench along the longitudinal direction of the trench, and disposed in adjacent to the $n^+$-type emitter region.

According to the subject matter of claim 4, the p-type base region includes a base region and a heavily doped $p^+$-type contact region in the insulated gate semiconductor device described in claim 3.

According to the subject matter of claim 5, the method of manufacturing the insulated gate semiconductor device described in claim 4 includes the step of forming the p-type diffusion region simultaneously with forming the heavily doped $p^+$-type contact region.

According to the invention, there is provided an insulated gate semiconductor device such as a trench-type IGBT, including unit cells scattered uniformly throughout the active region and having a trench gate structure, that minimizes the variation of the gate threshold voltage.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Now the invention will be described in detail hereinafter with reference to the accompanied drawings which illustrate the preferred embodiments of the invention.

First Embodiment

Now a trench-type insulated-gate semiconductor device according to a first embodiment of the invention will be described with reference to FIGS. 1(a)-5(b). Below, the manufacturing steps for manufacturing a vertical trench-type insulated-gate power semiconductor device will be described in connection with the manufacture of an IGBT exhibiting a breakdown voltage of 1200 V.

Figure 1A:
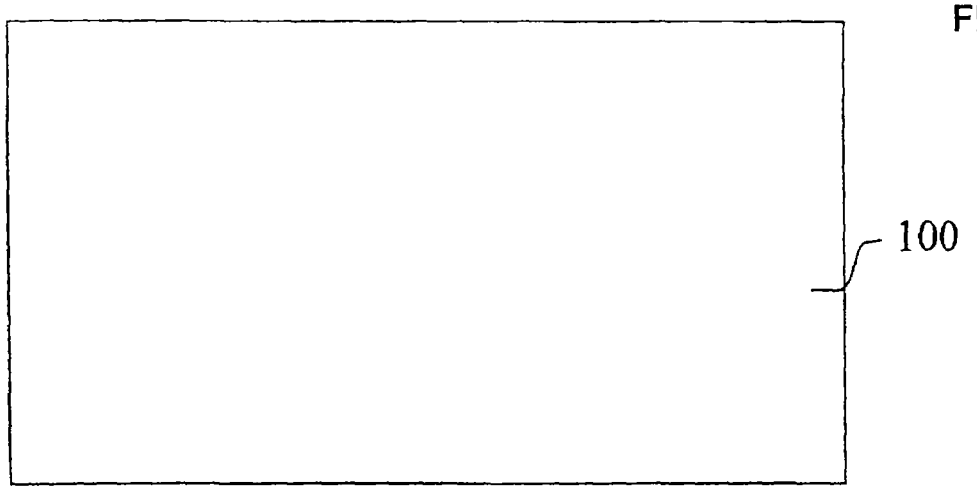
FIG. 1(a) is a first cross sectional view of a silicon substrate for describing the manufacturing steps for manufacturing a trench IGBT according to a first embodiment of the invention.

Referring at first to FIG. 1(a), n-type FZ semiconductor silicon substrate 100 is prepared in the same manner as in the prior art. Substrate 100 includes an n$^-$-type region that will be a drift layer in the surface portion thereof. Substrate 100 exhibits the resistivity of 50 to 80 Ωcm in the (100) plane. A resist mask pattern (not shown) for forming a guard ring layer is formed on one major surface of a semiconductor chip. (The guard ring layer is formed around an active region as a structure for sustaining a breakdown voltage. The guard ring layer functions to relax the electric field in the chip surface.) Then, a guard ring layer (not shown) is formed in the circumference portion of the chip by implanting a p-type impurity, by removing the resist, and by treating the chip thermally. Oxide film 101 is formed by heat treatment. Openings are formed in oxide film 101 through a photolithographic step.

Figure 1B:
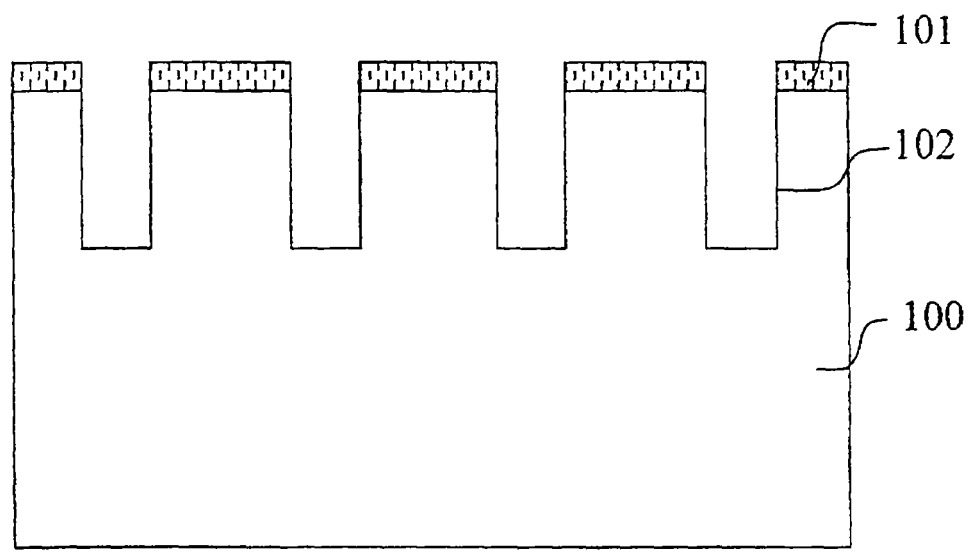
FIG. 1(b) is a second cross sectional view of the silicon substrate for describing the manufacturing steps for manufacturing the trench IGBT according to the first embodiment.

Referring now to FIG. 1(b), trenches 102 are formed by etching the portions of semiconductor silicon substrate 100 under the openings to a predetermined depth using oxide film 101 as a mask. According to the first embodiment, openings, each 0.8 μm in width, are formed through oxide film 101 such that the adjacent openings are spaced apart 5 μm from each other. Trenches 102 are formed by anisotropic reactive ion etching (hereinafter referred to as "RIE"). To remove the defect layers caused in the trench wall by the formation of trenches 102 in silicon substrate 100, a sacrifice oxide film (not shown) is formed in trench 102 by thermal oxidation. The defect layers caused in the trench wall are removed by removing the sacrifice oxide film. Then, all the oxide films in the active region are removed temporarily.

Figure 2A:
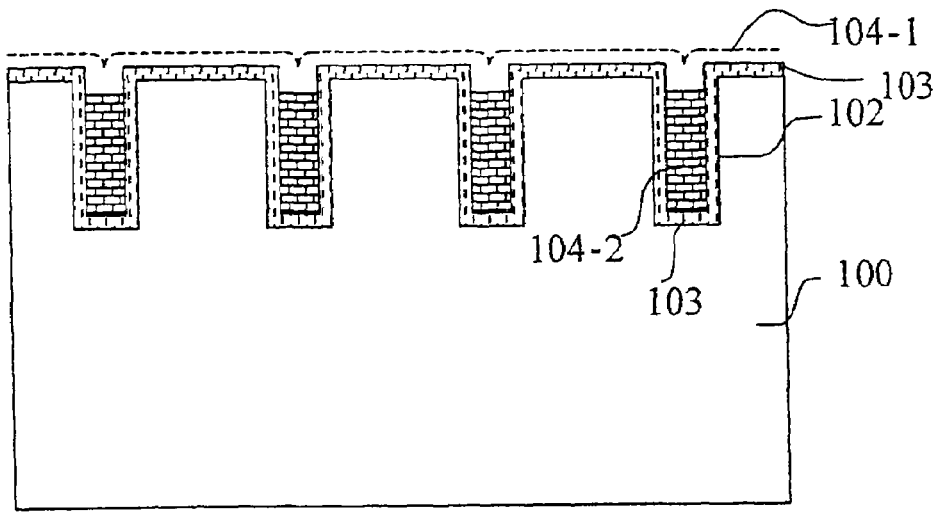
FIG. 2(a) is a third cross sectional view of the silicon substrate for describing the manufacturing steps for manufacturing the trench IGBT according to the first embodiment.

Referring now to FIG. 2(a), gate oxide film 103 of 80 to 120 nm in thickness is formed in trench 102. As shown by a broken line in FIG. 2(a), an electrically-conductive polycrystalline silicon film 104-2 is buried in trench 102, further, an electrically-conductive polycrystalline silicon film 104-1, 0.5 to 1.0 μm in thickness, is deposited on the entire silicon substrate surface by the CVD method under a reduced pressure. Polycrystalline silicon films 104-1 and 104-2 are doped with phosphorus atoms, boron atoms and such impurity atoms. Then, doped polycrystalline silicon film 104-1 is etched back by anisotropic gas etching or by isotropic gas etching. By stopping the etching of polycrystalline silicon film 104-1 when oxide film 103 on the surface of silicon substrate 100 is exposed, a gate electrode 104-2 is formed in trench 102 as shown in FIG. 2(a). By etching back polycrystalline silicon film 104-1 as far as the deposited film thickness thereof, gate electrode 104-2 is etched back for 100 to 150 nm from the top of trench 102. Hereinafter, gate electrode 104-2 is designated simply by the reference numeral 104.

Figure 2B:
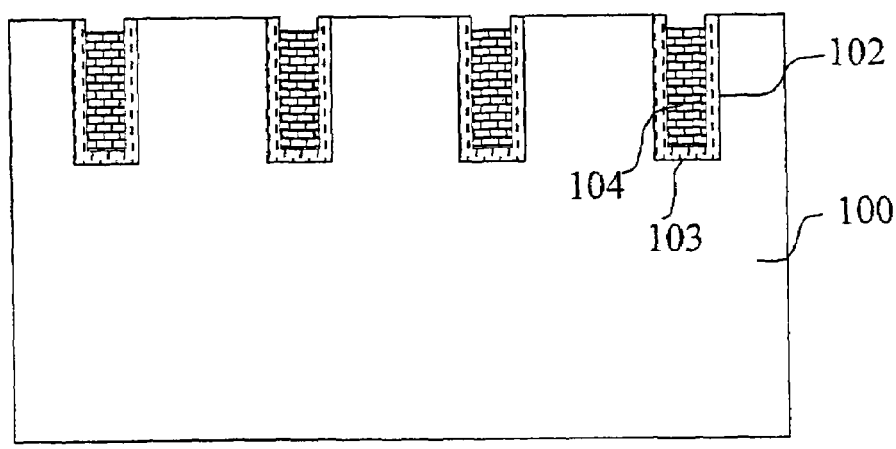
FIG. 2(b) is a fourth cross sectional view of the silicon substrate for describing the manufacturing steps for manufacturing the trench IGBT according to the first embodiment.

Referring now to FIG. 2(b), the surface of silicon substrate 100 is exposed by removing oxide film 103 only from the substrate surface. To remove oxide films 103, it is preferable to employ anisotropic etching for the reasons described below. First, oxide film 103 on the upper portion of the trench side wall is left unetched and thick. Second, the ion implantation planes, from which ions are implanted for forming p-type base regions, p$^+$-type body regions and n$^+$-type emitter regions later, can be set to be coplanar. Third, the p-type base regions can be formed after forming the trenches and, therefore, the diffusion depth of the p-type base regions can be set to be shallow. Fourth, boron atoms are prevented from being contained in the thermal oxide films during the formation thereof.

Figure 3A:
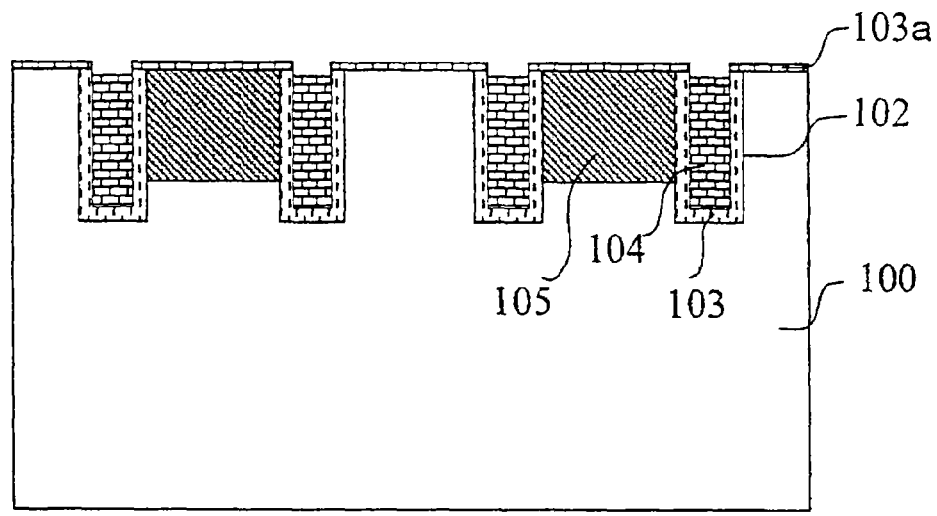
FIG. 3(a) is a fifth cross sectional view of the silicon substrate for describing the manufacturing steps for manufacturing the trench IGBT according to the first embodiment.
Figure 3B:
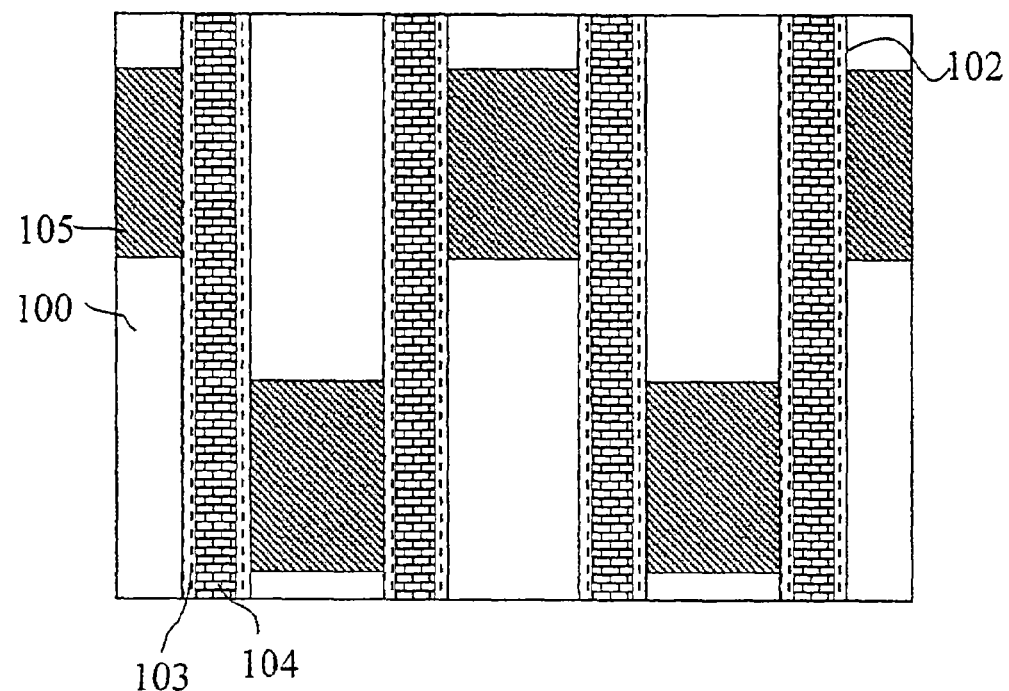
FIG. 3(b) is a top plan view of the silicon substrate shown in FIG. 3(a)

Referring now to FIG. 3(a), thermal oxide films 103a are formed such that thermal oxide films 103a are 20 to 50 nm in thickness, that is, thin enough for boron ions or arsenic ions to penetrate. As shown in FIG. 3(b), the top plan view of the silicon substrate shown in FIG. 3(a), p-type diffusion regions 105 are formed in the surface portions of silicon substrate 100 between trenches 102 extended in parallel to each other. The p-type diffusion regions are formed such that the p-type diffusion regions are aligned in perpendicular to trenches 102 and the lines of the p-type diffusion regions are arranged in parallel to each other. The p-type diffusion regions are formed selectively to the depth of around 4 μm by implanting boron ions under the acceleration voltage of 50 keV and at the dose amount of $1 \times 10^{13}$ cm$^{-2}$ to $5 \times 10^{13}$ cm$^{-2}$ and by a thermal diffusion treatment conducted at 1100° C. FIG. 3(b) shows p-type base regions 105 by shaded areas having a width resulted by the thermal diffusion treatment.

Figure 4A:
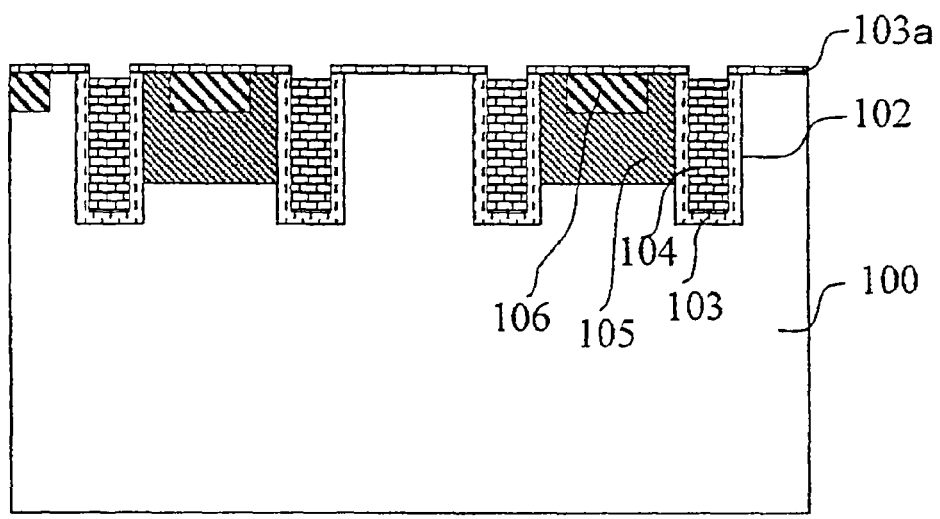
FIG. 4(a) is a sixth cross sectional view of the silicon substrate for describing the manufacturing steps for manufacturing the trench IGBT according to the first embodiment.

Referring now to FIG. 4(a), a p$^+$-type body region 106 is formed in the central surface portion of p-type base region 105 such that p$^+$-type body region 106 is positioned in the center of the substrate surface portion between trenches 102. In detail, p$^+$-type body region 106 is formed as described below. A window is formed by the photolithographic technique in the portion of a resist mask, under which p$^+$-type body region 106 will be formed. Boron ions are implanted through the window under the acceleration voltage of 100 keV and at the dose amount of $1 \times 10^{15}$ cm$^{-2}$ to $5 \times 10^{15}$ cm$^{-2}$.

Finally, the implanted boron atoms are diffused thermally at 1000° C. to form p$^+$-type body region 106.

Figure 4B:
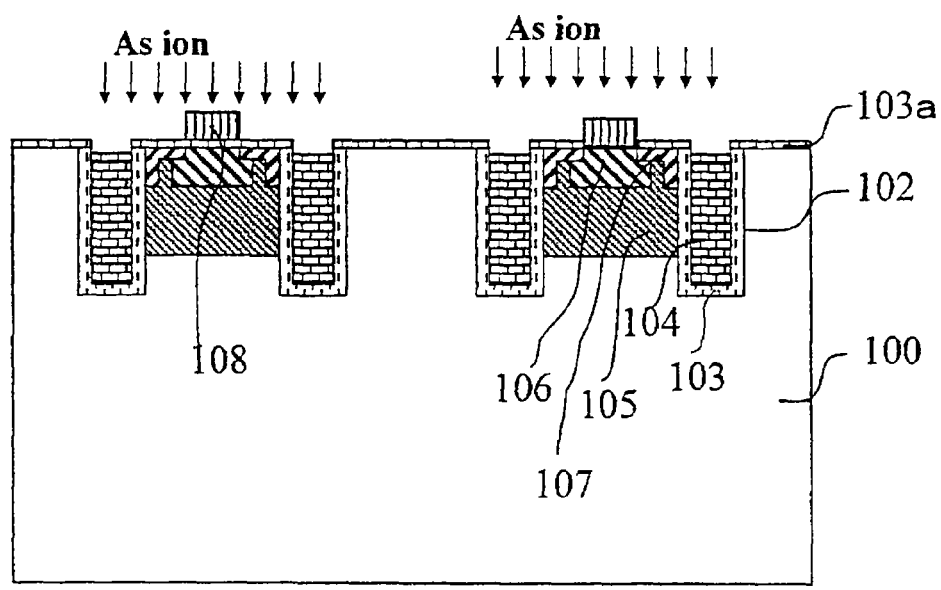
FIG. 4(b) is a seventh cross sectional view of the silicon substrate for describing the manufacturing steps for manufacturing the trench IGBT according to the first embodiment.

Referring now to FIG. 4(b), n$^+$-type emitter regions 107 are formed in the surface portions of p-type base region 105 in the vicinities of trenches 102 through the photolithographic step, the step of arsenic ion implantation and the subsequent step of thermal treatment. Arsenic ions (As ions) are implanted as shown by the arrows in FIG. 4(b), using a resist mask 108 under the acceleration voltage of 100 to 200 keV and at the dose amount of $1\times10^{15}$ cm$^{-2}$ to $5\times10^{15}$ cm$^{-2}$.

Figure 5A:
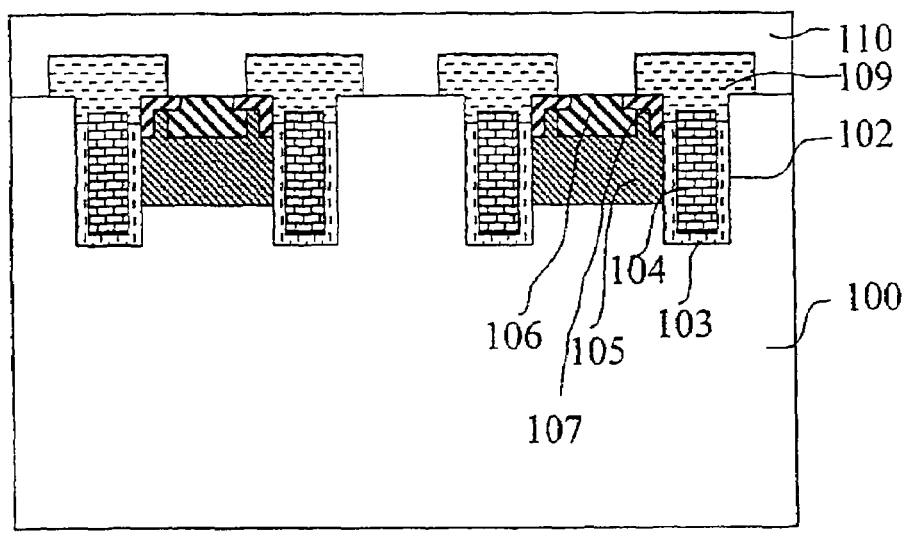
FIG. 5(a) is an eighth cross sectional view of the silicon substrate for describing the manufacturing steps for manufacturing the trench IGBT according to the first embodiment.
Figure 5B:
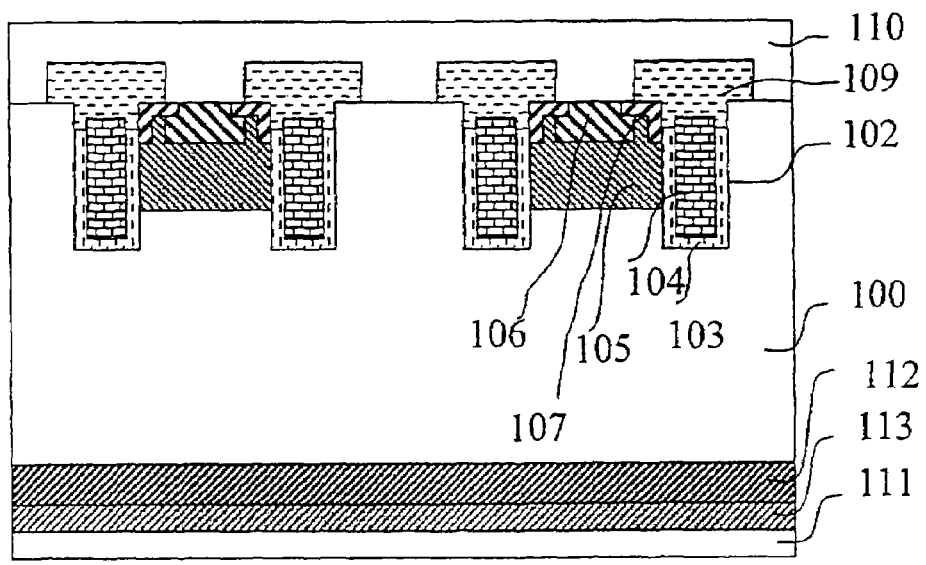
FIG. 5(b) is a ninth cross sectional view of the silicon substrate for describing the manufacturing steps for manufacturing the trench IGBT according to the first embodiment.

Referring now to FIGS. 5(a) and 5(b), the entire substrate surface is covered with interlayer insulator film 109 of a borophosphosilicate glass (hereinafter referred to as a "BPSG"). Contact regions for making n$^+$-type emitter regions 107 and p$^+$-type body regions 106 in the surface portion of substrate 100 contact with a metal electrode (emitter electrode) 110 are formed through a photolithographic step. As a result, gate electrode 104 in trench 102 is covered with BPSG interlayer insulator film 109.

Then, a metal film such as an aluminum film is deposited by sputtering or a similar technique. By patterning the metal film and by converting the metal film to an alloy film, metal electrode (emitter electrode) 110 that will work as emitter electrode 110 is formed on the entire active region surface. If necessary, it is preferable to coat the entire chip surface with a passivation film.

Then, silicon substrate 100 is polished as shown in FIG. 5(a) from the other major surface such that silicon substrate 100 has a thickness, e.g., 150 to 180 µm, determined by the designed breakdown voltage. Then, as shown in FIG. 5(b), n$^+$-type field stop layer 112, and p$^+$-type collector layer 113 are formed through the steps of ion implantation and subsequent thermal treatment. As collector electrode 111 is formed, a trench IGBT in the wafer stage is completed. Depending on the type of the IGBT, n$^+$-type field stop layer 112 may be unnecessary. When an n$^-$/n$^{++}$/p$^{++}$ substrate is used for the silicon substrate, it is necessary to form neither n$^+$-type field stop layer 112 nor p$^+$-type collector layer 113. It is preferable to increase the surface concentration in n$^+$-type emitter region 107 by forming n$^+$-type emitter region 107 through two separate steps, since an excellent ohmic contact is obtained.

Figure 6:
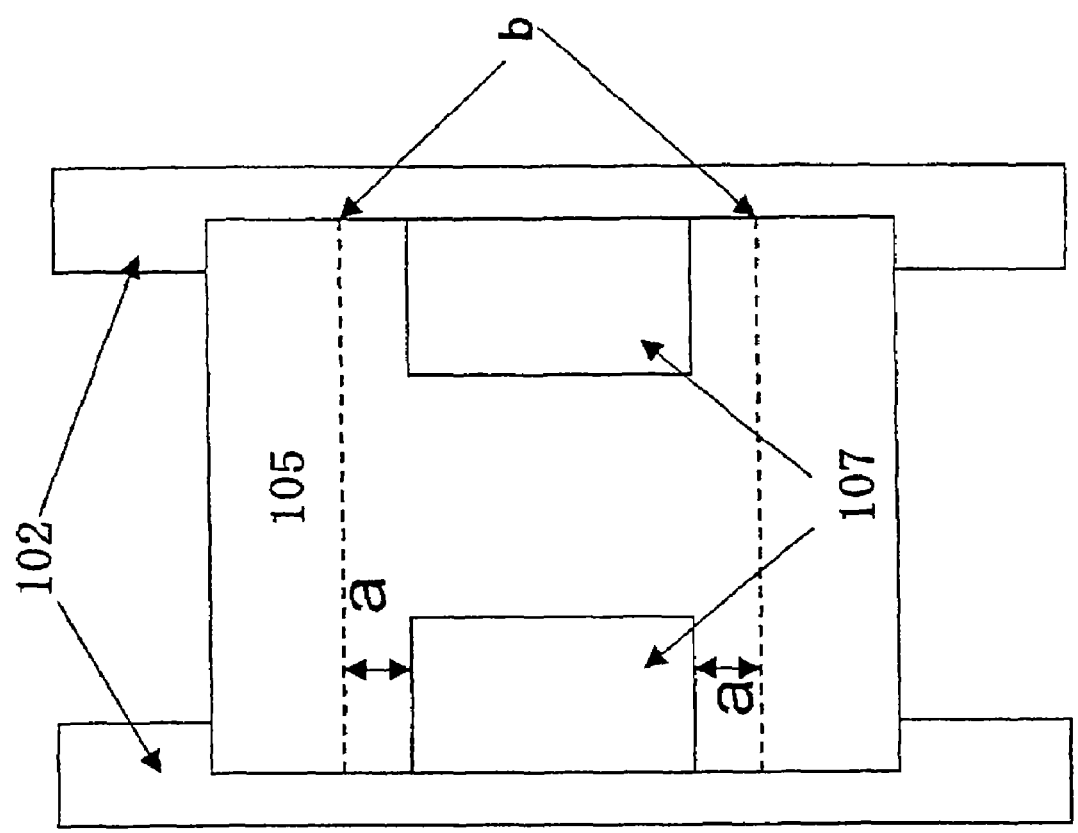
FIG. 6 is a top plan view for showing a unit cell in the IGBT according to the first embodiment.
Figure 7:
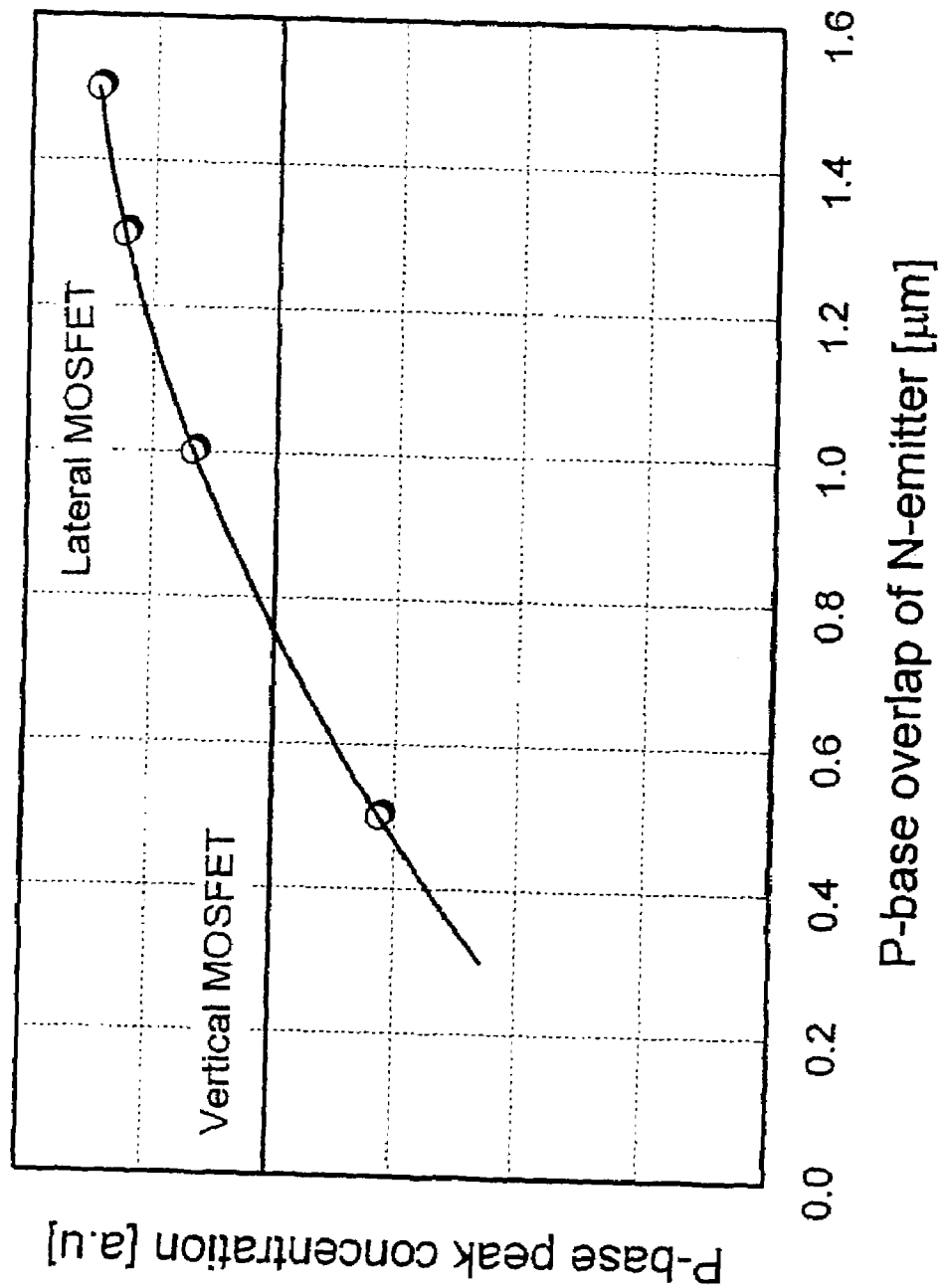
FIG. 7 is a graph for relating the peak concentration in a p-type base region with the overlap length of the p-type base region and an n$^+$-type emitter region.

FIG. 6 shows the top plan view of p-type base region 105 in the IGBT according to the first embodiment. The double-headed arrow a in FIG. 6 indicates the overlap length between n$^+$-type emitter region 107 and the boundary of the ion implantation window for forming p-type base region 105 illustrated by broken lines. FIG. 7 shows the peak concentration change with the overlap length a. FIG. 7 indicates that the peak concentration in the portion of p-type base region 105 in the vertical MOSFET structure is lower than the peak concentration in the portion of p-type base region 105 in the lateral MOSFET structure when the overlap length a is 0.8 µm or longer. The gate threshold voltage is lower as the peak concentration is lower. Therefore, for determining the gate threshold voltage by the MOSFET structure in the depth direction of trench 102, it is necessary to set the overlap length a to be 0.8 µm or longer.

Second Embodiment

Figure 8:
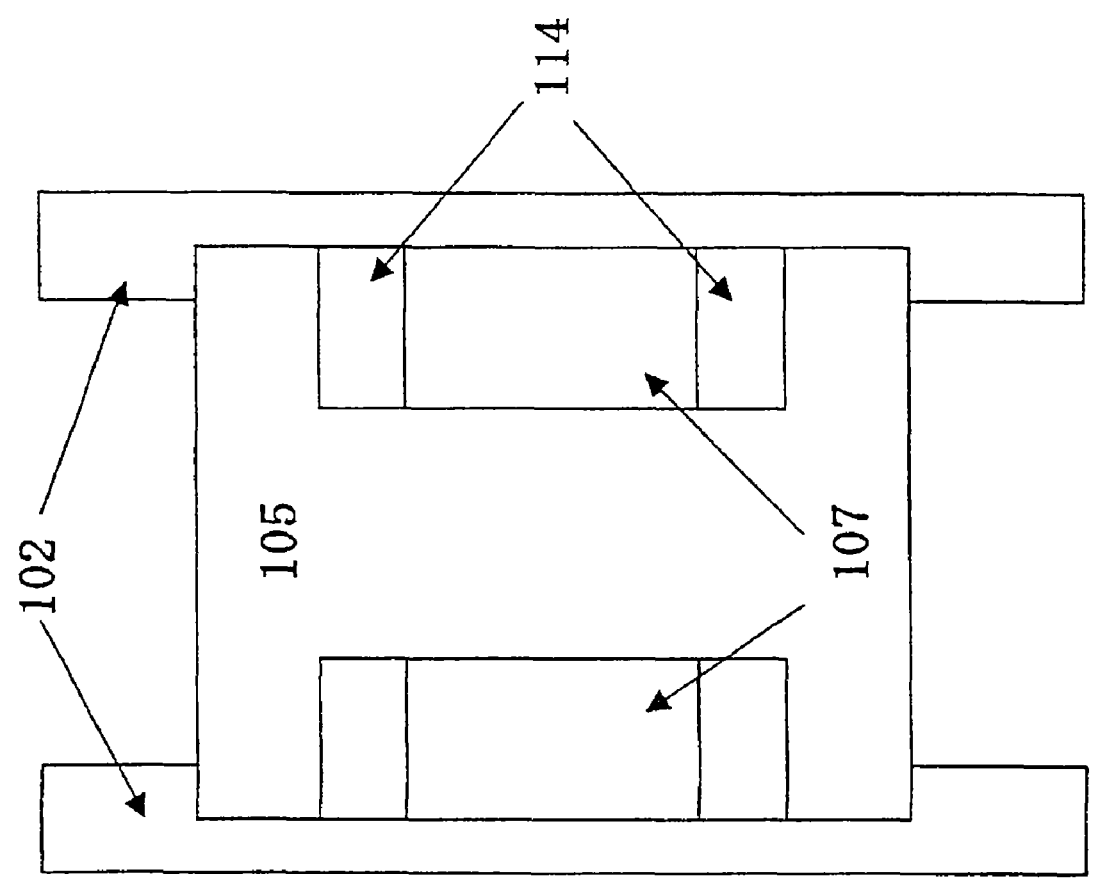
FIG. 8 is a top plan view for showing a unit cell in a trench IGBT according to a second embodiment of the invention.
Figure 9:
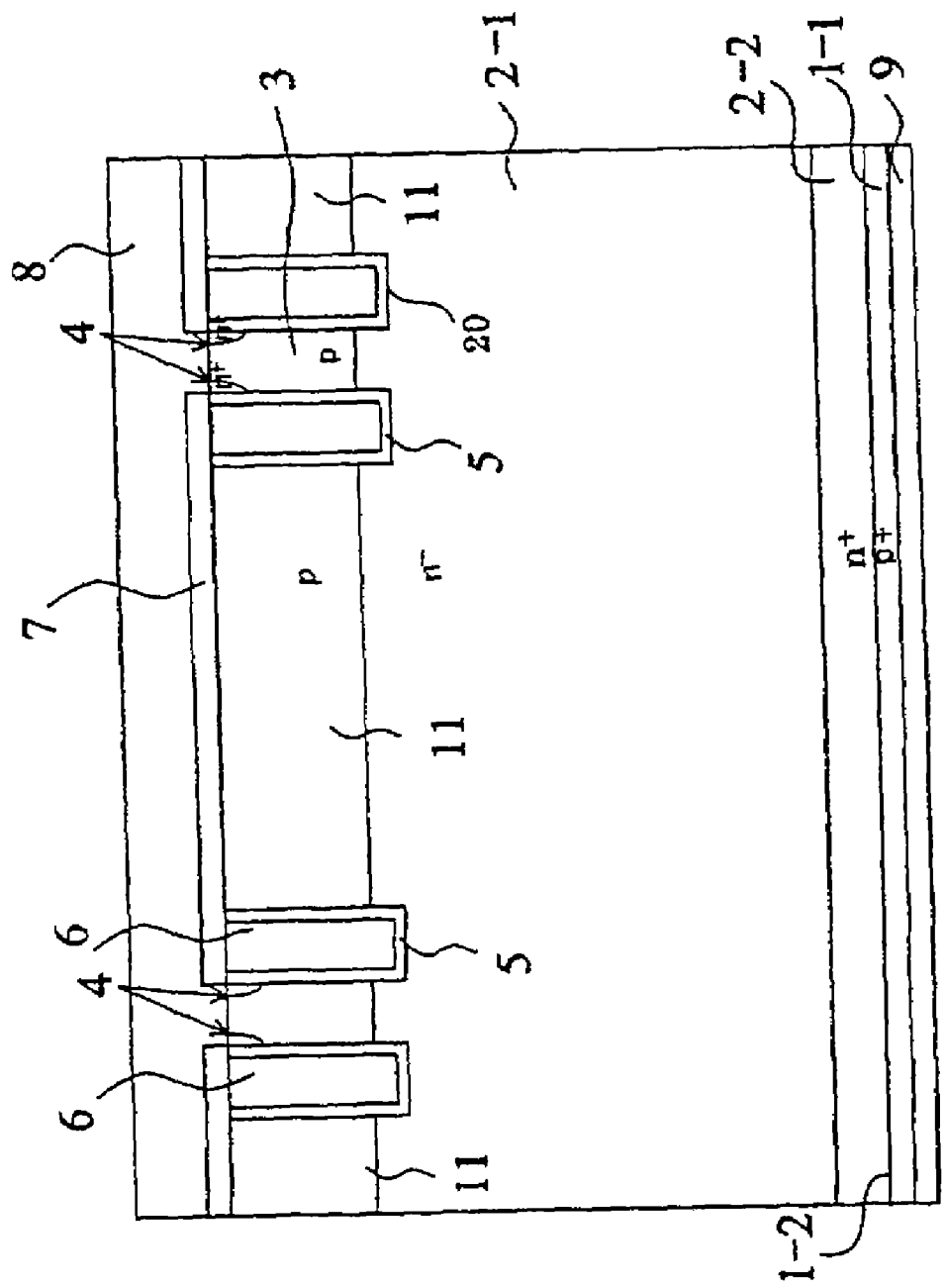
FIG. 9 is a cross sectional view of a conventional trench IGBT.
Figure 10:
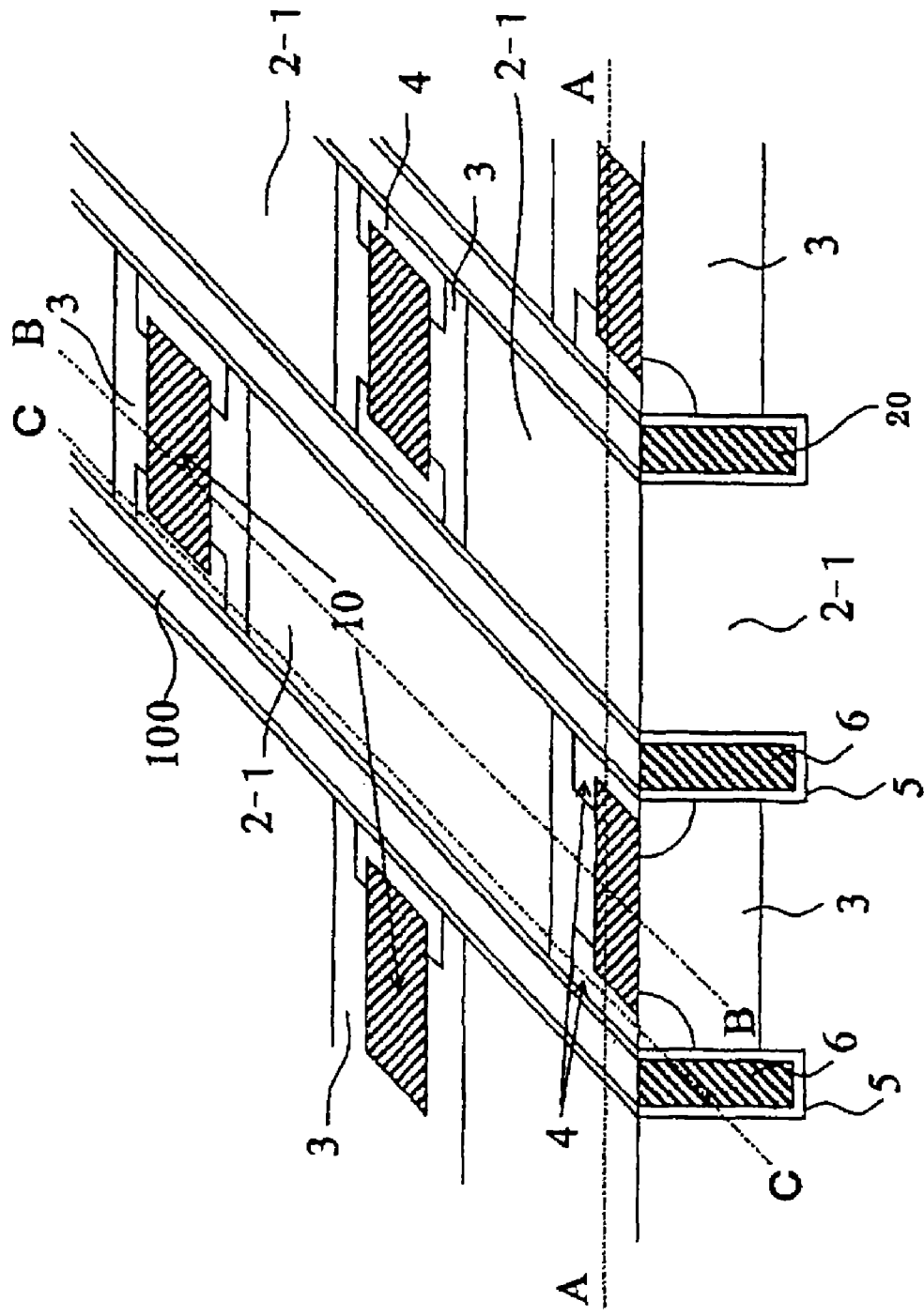
FIG. 10 is a perspective and cross sectional view of a trench IGBT taken in perpendicular to the wafer surface and trenches.
Figure 11:
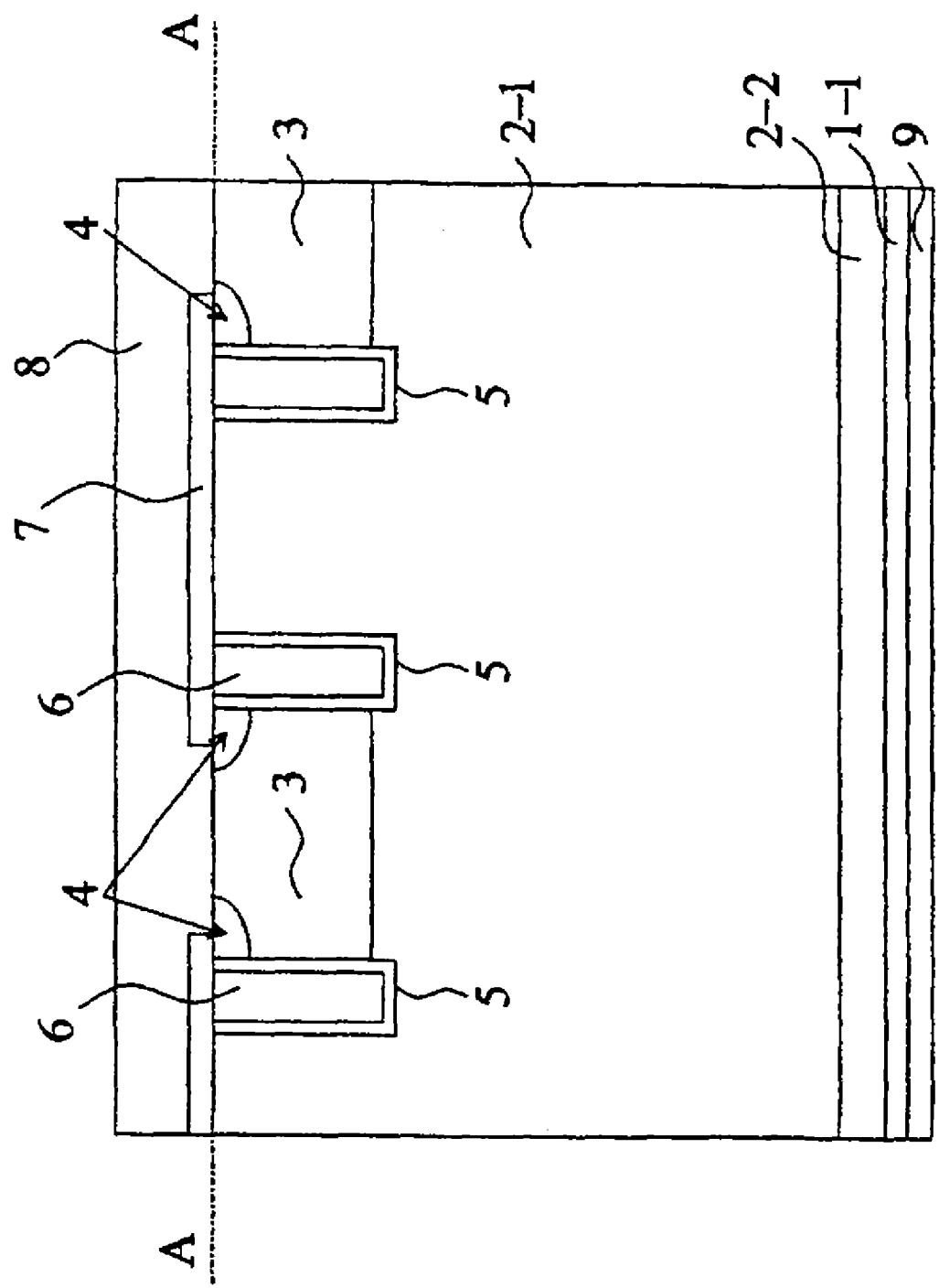
FIG. 11 is a cross sectional view taken along line segment A-A of FIG. 10.
Figure 12:
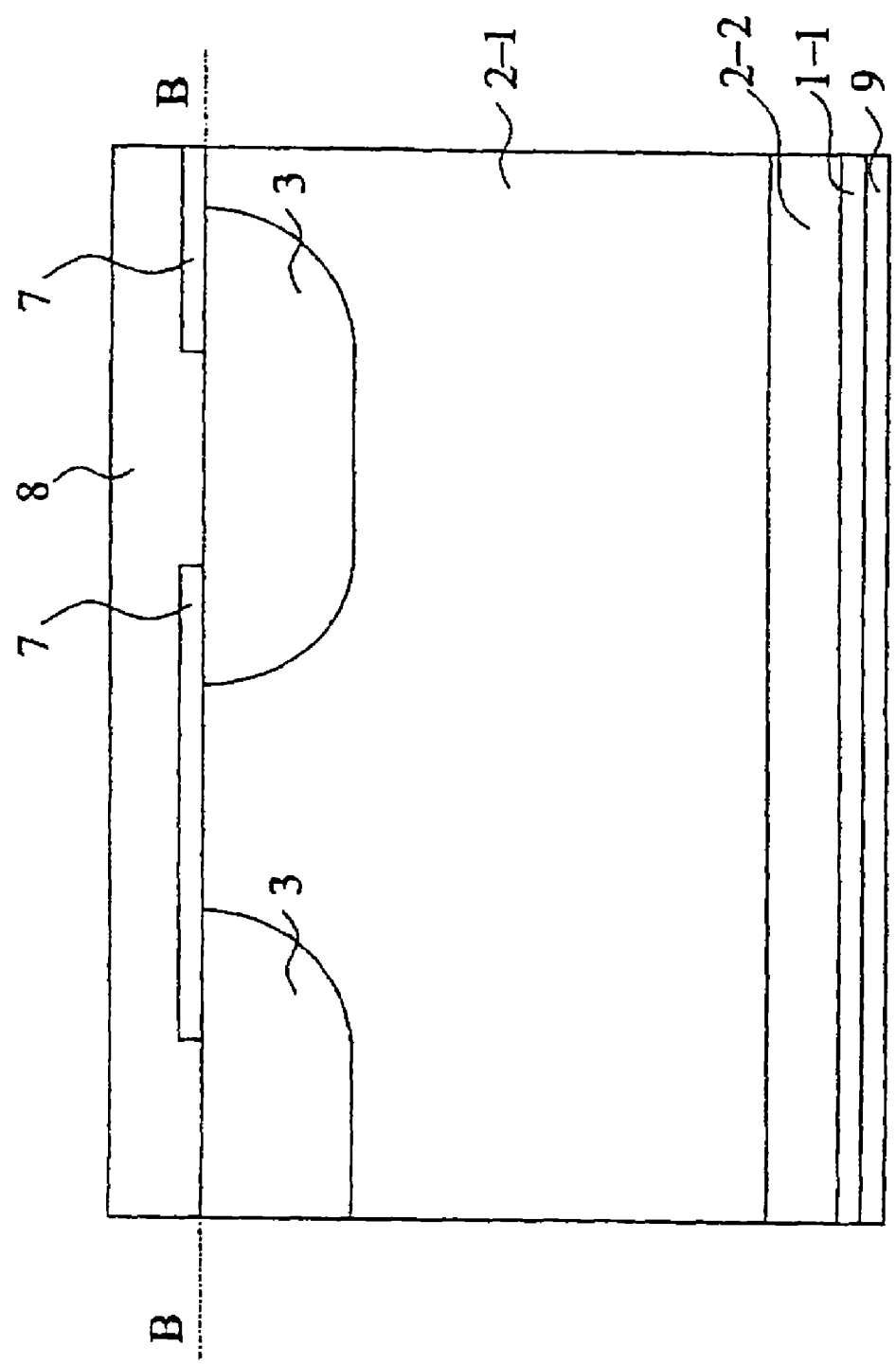
FIG. 12 is a cross sectional view taken along line segment B-B of FIG. 10.
Figure 13:
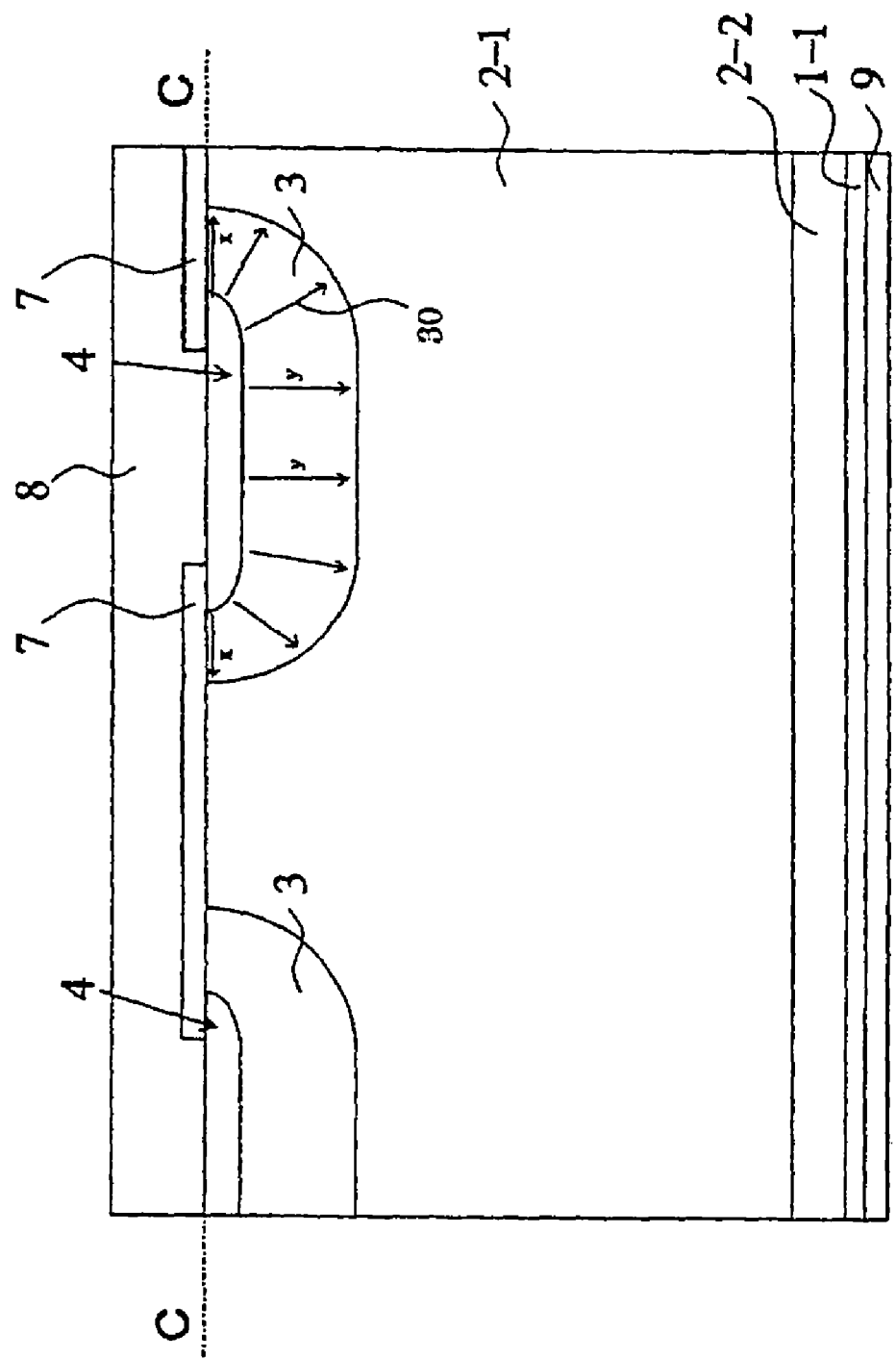
FIG. 13 is a cross sectional view taken along line segment C-C of FIG. 10.

FIG. 8 shows the top plan view of a unit cell in a trench IGBT according to a second embodiment of the invention. As shown in FIG. 8, p$^+$-type diffusion regions 114, doped more heavily than p-type base region 105, are formed such that p$^+$-type diffusion regions 114 are positioned along trench 102 and adjacent to n-type emitter region 107. As p$^+$-type diffusion regions 114 are formed as described above, the gate threshold is determined automatically by the MOSFET structure in the depth direction of trench 102. If p$^+$-type diffusion regions 114 are formed simultaneously with p$^+$-type body regions 106, p$^+$-type diffusion regions 114 doped more heavily than p-type base region 105 will be formed without increasing the number of manufacturing steps. Therefore, an effective manufacturing process can be obtained.

While the present invention has been particularly shown and described with reference to the preferred embodiments thereof, it will be understood by those skilled in the art that the foregoing and other changes in form and details can be made without departing from the spirit and scope of the present invention. All modifications and equivalents attainable by one versed in the art from the present disclosure within the scope and sprit of the present invention are to be included as further embodiments of the invention. The scope of the present invention accordingly is to be defined as set forth in the appended claims.

What is claimed is:

1. An insulated gate semiconductor device comprising:
a first semiconductor layer of a first conductivity type;
a second semiconductor layer of a second conductivity type on a first major surface of the first semiconductor layer;
trenches in a surface portion of the second semiconductor layer, the trenches extending in parallel to each other and forming a planar stripe pattern;
third semiconductor regions of the first conductivity type in the surface of the second semiconductor layer arranged between every other of the trenches along a direction perpendicular to a longitudinal direction of the trenches so that the third semiconductor regions are alternately arranged with surface regions of the second semiconductor layer existing between the trenches along the surface of the second semiconductor layer;
a fourth semiconductor region of the second conductivity type arranged selectively in a surface portion of the third semiconductor region;
a gate electrode in each trench with a gate insulator film interposed between the gate electrode and a wall of the trench;
an emitter electrode in electrical contact commonly with the third semiconductor region and the fourth semiconductor region; and
a collector electrode in contact with a second major surface of the first semiconductor layer;
wherein, in a portion of the third semiconductor region in contact with the gate electrode via the gate insulator film, an impurity concentration in a portion of the third semiconductor region sandwiched between a bottom plane of the fourth semiconductor region and a bottom plane of the third semiconductor region and parallel to the first major surface of the first semiconductor layer is the lowest.

2. The insulated gate semiconductor device according to claim 1, wherein an ion implantation window for forming the third semiconductor region overlaps onto the fourth semiconductor region for 0.8 µm or longer.

3. The insulated gate semiconductor device according to claim 1, the insulated gate semiconductor device further comprising:
a fifth semiconductor region of the first conductivity type doped more heavily than the third semiconductor region, the fifth semiconductor region being in contact with the trench along the longitudinal direction of the trench, and the fifth semiconductor region being disposed adjacent to the fourth semiconductor region.

4. The insulated gate semiconductor device according to claim 3, wherein the third semiconductor region comprises a base region of the first conductivity type and a heavily doped contact region of the first conductivity type.

5. An insulated gate semiconductor device as described in claim 4, wherein the fifth semiconductor region is formed simultaneously with the heavily doped contact region of the first conductivity type.

6. A method of manufacturing an insulated gate semiconductor device as described in claim 1, comprising:

providing a first semiconductor layer of a first conductivity type;

forming a second semiconductor layer of a second conductivity type on a first major surface of the first semiconductor layer;

forming trenches in a surface portion of the second semiconductor layer, the trenches extending in parallel to each other and forming a planar stripe pattern;

forming a third semiconductor region of the first conductivity type in the surface portion of the second semiconductor layer between an adjacent pair of the trenches, the third semiconductor regions being disposed selectively along a longitudinal direction of the trench, with a specified spacing between adjacent third semiconductor regions, the third semiconductor regions being disposed in every other surface portion of the second semiconductor layer between the trenches and perpendicular to the longitudinal direction of the trenches;

forming a fourth semiconductor region of the second conductivity type arranged selectively in a surface portion of the third semiconductor region;

forming a gate electrode in each trench with a gate insulator film interposed between the gate electrode and a wall of the trench;

forming an emitter electrode in electrical contact commonly with the third semiconductor region and the fourth semiconductor region; and forming a collector electrode in contact with a second major surface of the first semiconductor layer; wherein an impurity concentration in a portion of the third semiconductor region sandwiched between a bottom plane of the fourth semiconductor region and a bottom plane of the third semiconductor region and parallel to the first major surface of the first semiconductor layer is the lowest in a portion thereof sandwiched between the fourth semiconductor region and the second semiconductor layer and in contact with the gate electrode via the gate insulator film.

7. The method according to claim 6, additionally comprising forming a fifth semiconductor region of the first conductivity type doped more heavily than the third semiconductor region, the fifth semiconductor region being in contact with the trench along the longitudinal direction of the trench, and the fifth semiconductor region being disposed adjacent to the fourth semiconductor region.

8. The method according to claim 7, wherein the fifth semiconductor region is formed simultaneously with the heavily doped contact region of the first conductivity type.

* * * * *